United States Patent [19]
Sugiyama et al.

[11] Patent Number: 5,319,520
[45] Date of Patent: Jun. 7, 1994

[54] ELECTRONIC EQUIPMENT ASSEMBLY OF TIERED TYPE

[75] Inventors: Akira Sugiyama, Hino; Tsutomu Hoshino, Ootsuki; Koichiro Suda, Fuchu, all of Japan

[73] Assignee: Kabushiki Kaisha Toshiba, Kanagawa, Japan

[21] Appl. No.: 981,298

[22] Filed: Nov. 25, 1992

[30] Foreign Application Priority Data

Nov. 26, 1991 [JP] Japan .................. 3-097005[U]
Nov. 29, 1991 [JP] Japan .................. 3-098833[U]
Feb. 25, 1992 [JP] Japan .................. 4-008353[U]

[51] Int. Cl.$^5$ .................................. H05K 7/20
[52] U.S. Cl. ................................. 361/693; 211/41; 361/735; 361/801; 361/831
[58] Field of Search ............... 165/80.3; 174/16.1; 211/41; 361/382, 383, 396, 412, 413, 415, 428, 429, 796, 801, 802, 784, 785, 788, 826, 827, 829, 831, 735, 689, 690, 692, 693; 62/259.2; 439/61, 62, 485

[56] References Cited

U.S. PATENT DOCUMENTS

| | | | |
|---|---|---|---|
| 4,321,654 | 3/1982 | Nakajo | 361/396 |
| 4,984,133 | 1/1991 | Cassanova | 361/415 |
| 5,067,040 | 11/1991 | Fallik | 361/384 |
| 5,128,833 | 7/1992 | Lin | 361/415 |
| 5,210,680 | 5/1993 | Scheibler | 361/384 |

FOREIGN PATENT DOCUMENTS

| | | | |
|---|---|---|---|
| 1140613 | 11/1962 | Fed. Rep. of Germany | 361/383 |
| 292695 | 11/1988 | Japan | 361/415 |

Primary Examiner—Gerald P. Tolin
Attorney, Agent, or Firm—Finnegan, Henderson, Farabow, Garrett & Dunner

[57] ABSTRACT

In an electronic equipment assembly having a plurality of electronic equipment housings tiered, a horizontal air passageway is formed on the lower surface of each bottom plate of each electronic equipment housing, air ventilation openings being formed on the top plate thereof, vertical ducts open to the horizontal air passageway being formed on the outside of the side plate, the cross section of each vertical duct being the same in shape and size. When two electronic equipment housings are tiered, common vertical ducts are formed, through which heated air can be expelled and cables can be routed.

14 Claims, 7 Drawing Sheets

ELECTRONIC EQUIPMENT ASSEMBLY OF TIERED TYPE

BACKGROUND OF THE INVENTION

1. Field of the Invention

The present invention relates to an electronic equipment assembly for housing an electronic circuitry unit, in particular, to an electronic equipment housing of tiered type where a plurality of housings are tiered and which has common ducts for heat radiating and cabling.

2. Description of the Related Art

In electronic equipment such as telephone exchanges, a so-called push-phone main unit of building block type where the same type units can be tiered for expansion according to an increase of the line capacity has been used. When transformers and electronic components mounted in the electronic equipment housings generate heat and thereby the temperature in the housings rises, the performance of the electronic equipment is adversely affected. To solve this problem, conventionally a large number of slit-shaped air intake openings and air exhaust openings are disposed on limited regions of the side walls of the housing. Fresh air is obtained to the inside of the housing through the air intake openings, thereby cooling the electronic equipment. The heated air is expelled to the outside through the air exhaust openings. However, in the electronic equipment housings which are tiered, the heated air which was expelled from a lower electronic equipment housing heats the bottom plate of the upper electronic equipment housing. Thus, since all the electronic equipment being tiered cannot be satisfactorily cooled, the electronic circuit units are thermally affected. Consequently, the reliability and safety of the equipment are deteriorated.

In addition, since the electronic equipment housings being tiered are electrically connected each other, terminals thereof should be connected with cables to each other. These cables are normally routed on the outside of the equipment. These cables diminish the appearance of the equipment. Moreover, when the electronic equipment housing is installed, these cables are sometimes scratched and damaged or disconnected from the connectors.

Therefore, an object of the present invention is to provide an electronic equipment assembly of tiered type having common vertical ducts for each of electronic equipment housings, wherein the common vertical ducts can be used for air passageways for heat radiating and cabling ducts.

SUMMARY OF THE INVENTION

To accomplish the above-mentioned object, the present invention is an electronic equipment assembly having a plurality of electronic equipment housings tiered in an upright shape, the electronic equipment housing having a bottom plate, a top plate, side plates, and a front panel, the electronic equipment housing containing electronic equipment, the improvement comprising a horizontal air passageway formed on the lower surface of the bottom plate, air ventilation openings formed on the top plate, and vertical ducts open to the horizontal air passageway and formed on the outside of the side plates, wherein common vertical ducts for heat radiating are formed when the electronic equipment housings are tiered.

According to the present invention, since ducts with the same cross section (that is, with the same shape and same size) are formed at the same position on both the sides of the electronic equipment housing, when a plurality of the electronic equipment housings are tiered, the heat generated by the electronic circuitry units can be expelled through horizontal air passageways and the vertical ducts. In addition, since the cables can be routed through the vertical ducts, the appearance of the equipment can become neat. Moreover, the cables can be prevented from being damaged and being disconnected from the connectors.

Next, with reference to FIGS. 1 to 8, an embodiment of the electronic equipment assembly of tiered type will be described.

DESCRIPTION OF PREFERRED EMBODIMENTS

Figure 1:
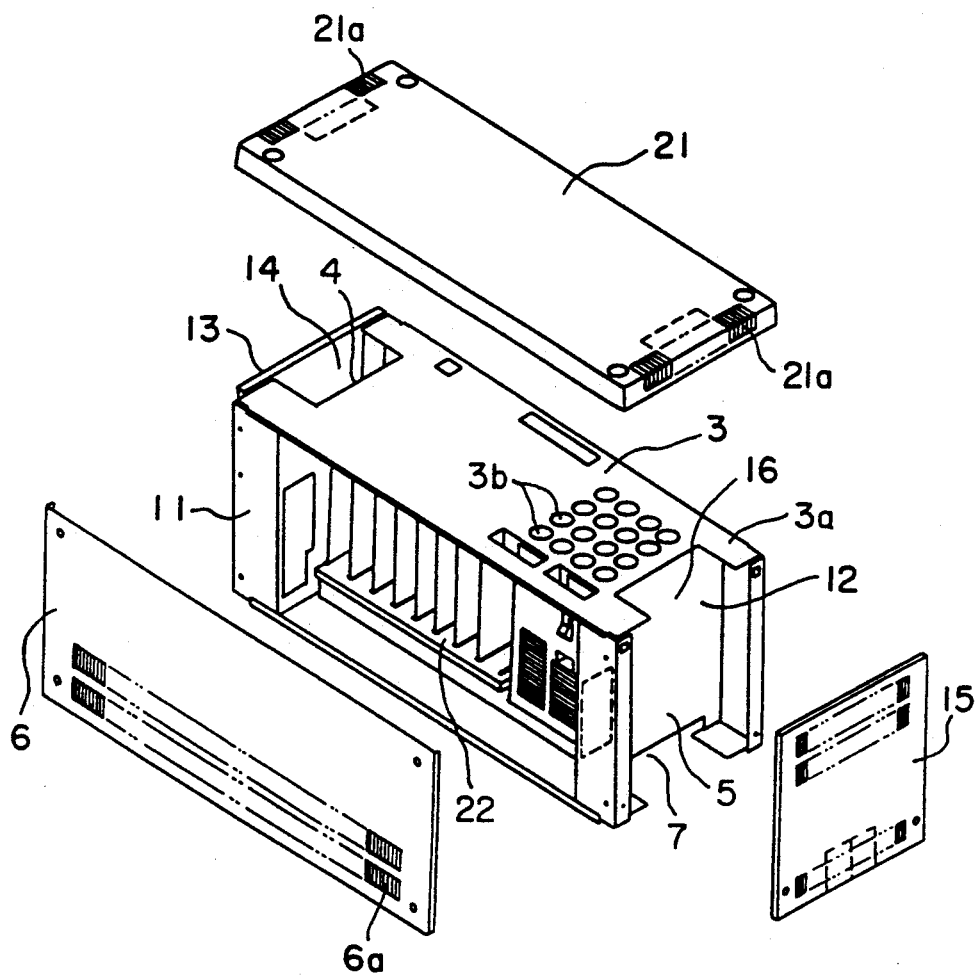
FIG. 1 is a perspective view showing an uppermost tiered electronic equipment housing in accordance with the present invention.
Figure 2:
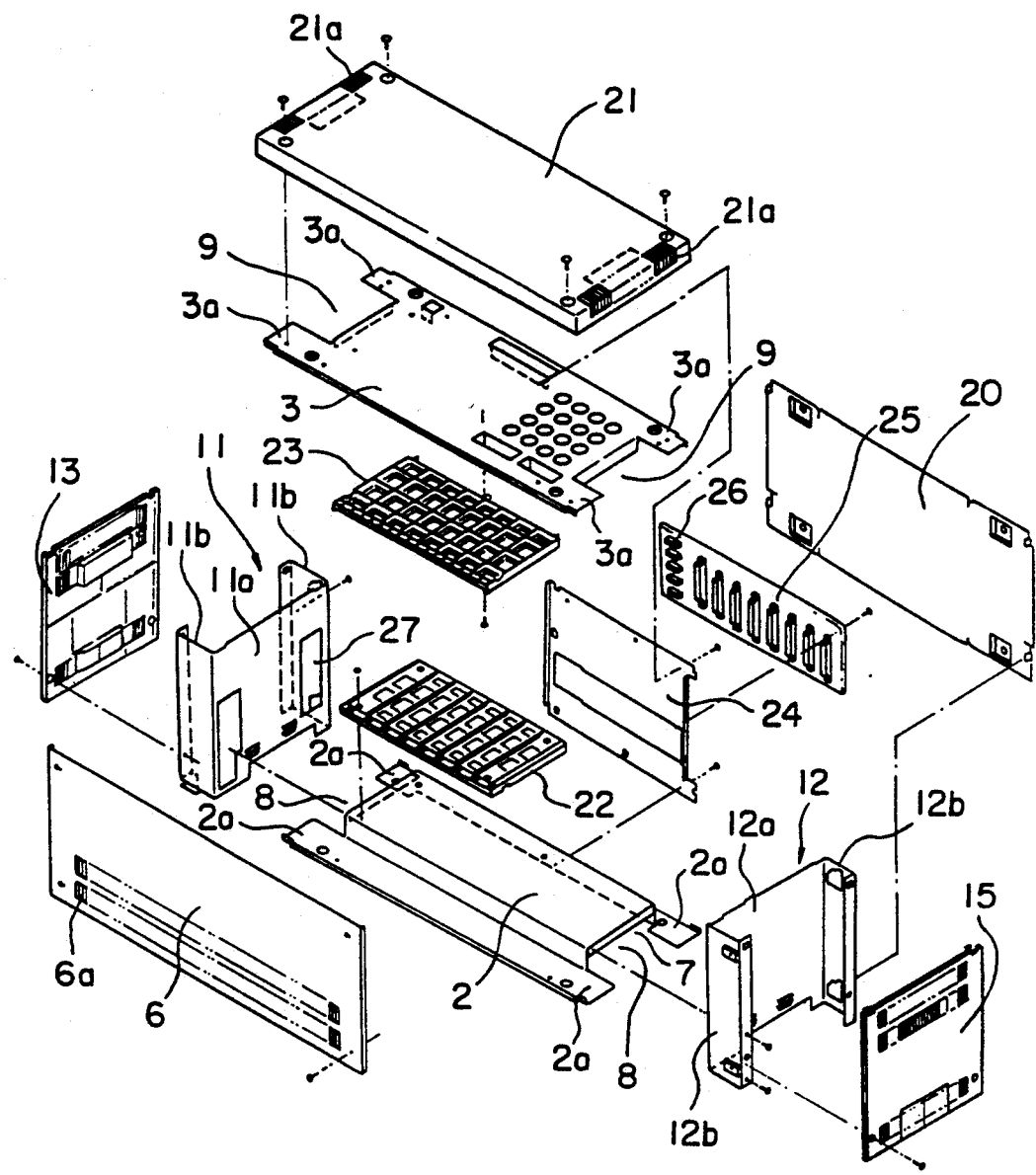
FIG. 2 is an exploded perspective view showing all parts of the electronic equipment housing in accordance with the present invention.

Referring to FIGS. 1 and 2, an electronic equipment housing 1 comprises a bottom plate 2, a top plate 3, a left side plate 4, a right side plate 5, and a front dress plate 6. At a lower region of the front dress plate 6a, slit-shaped air intake openings 6 are formed. On the lower surface of the bottom plate 2, a horizontal air passageway 7 is formed in the longitudinal direction thereof. From each of the left and right ends of the bottom plate 2, a pair of end protrusion members 2a are protruded. Between the pair of end protrusion members 2a, an opening 8 is formed. Likewise, from each of the left and right ends of the top plate 3, a pair of end protrusion members 3a are protruded. Between the pair of end protrusion members 3a, an opening 9 is formed. On the top plate 3, a plurality of air ventilation openings 3b are formed, which are open to the inside of the electronic equipment housing.

Left and right support plates 11 and 12 have a "]", or bracket, shaped cross section. The left support plate 11 consists of a flat main plate member 11a and bend members 11b which are bent from both the ends of the main plate member 11a. Likewise, the right support plate 12 consists of a flat main plate member 12a and bend members 12b which are bent from both the ends of the main plate member 12a. The left support plate 11 is fixed to the left end of the bottom plate 2 and the left end of the top plate 3 with screws so that the "]" shaped opening portion of the support plate 11 faces the outside of the housing 1 and the inner space of the "]" shaped cross section matches the left end opening 8 of the bottom plate 2 and the left end opening 9 of the top plate 3. Likewise, the right support plate 12 is fixed to the right end of the bottom plate 2 and the right end of the top plate 3 with screws so that the "]" shaped opening portion of the support plate 12 faces the outside of the housing 1 and the inner space of the "]" shaped cross section matches the right end opening 8 of the bottom plate 2 and the right end opening 9 of the top plate 3.

More specifically, the pair of bend members 11b of the left support plate 11 contact the pair of left end protrusion members 2a of the bottom plate 2 and the pair of left end protrusion members 3a of the top plate 3 so as to support and reinforce the end protrusion members 2a and 3a. Likewise, the pair of bend members 12b of the right support plate 12 contact the pair of right end protrusion members 2a of the bottom plate 2 and the pair of right end protrusion members 3a of the top plate 3 so as to support and reinforce the end protrusion members 2a and 3a.

A left dress plate 13 is detachably mounted on the left support plate 11 with screws so as to cover the "]" shaped opening portion of the left support plate 11. Thus, a left vertical duct 14 shown in FIG. 1 is formed. Likewise, a right dress plate 15 is detachably mounted on the right support plate 12 with screws so as to cover the "]" shaped opening portion of the right support plate 12. Thus, a vertical duct 16 is formed.

Figure 3:
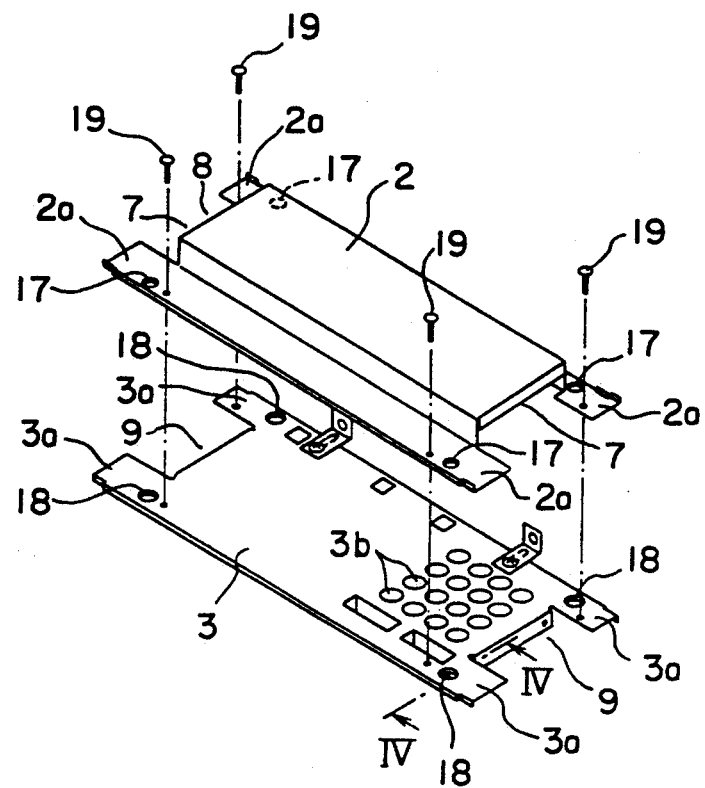
FIG. 3 is a perspective view showing a set of a bottom plate and a top plate of adjacently tiered electronic equipment housings.
Figure 4:
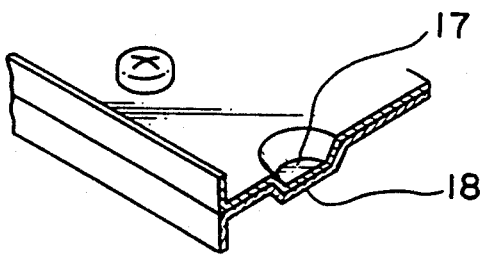
FIG. 4 is an enlarged perspective view showing a convex member and a concave member for positioning of a portion of FIG. 3.

As shown in FIGS. 3 and 4, at each of the four end protrusion members 2a of the bottom plate 2, a convex member 17 for positioning is formed. On the other hand, at each of the four end protrusion members 3a of the top plate 3, a concave member 18 for positioning is formed. When two electronic equipment housings 1 are correctly tiered each other, the convex members 17 and the corresponding concave members 18 are secured each other so as to position these upper and lower electronic equipment housings 1. The bottom plate 2 and the top plate 3 which were positioned are fixed with screws 19. Thus, the pair of electronic equipment housings 1 are fixed in the tiered style.

As shown in FIG. 1, both the front dress plate 6 and a rear plate 20 are fixed to the left and right support plates 11 and 12 with screws. In addition, a top dress plate 21 is fixed to the top plate 3 with screws. The top dress plate 21 has a plurality of slits 21a at the left and right ends thereof.

On the other hand, the electronic equipment housing 1 houses a pair of upper and lower circuit board guides 22 and 23 which guide and support plug-in units such as electronic circuit boards, a mother board mounting plate 24, a mother board 25 which is mounted thereon, and so forth. The circuit board guide 22 is fixed to the bottom plate 2 with screws. The other circuit board guide 23 is fixed to the top plate with screws. The mother board mounting plate 24 is fixed to both the bottom plate 2 and the top plate 3.

Figure 5:
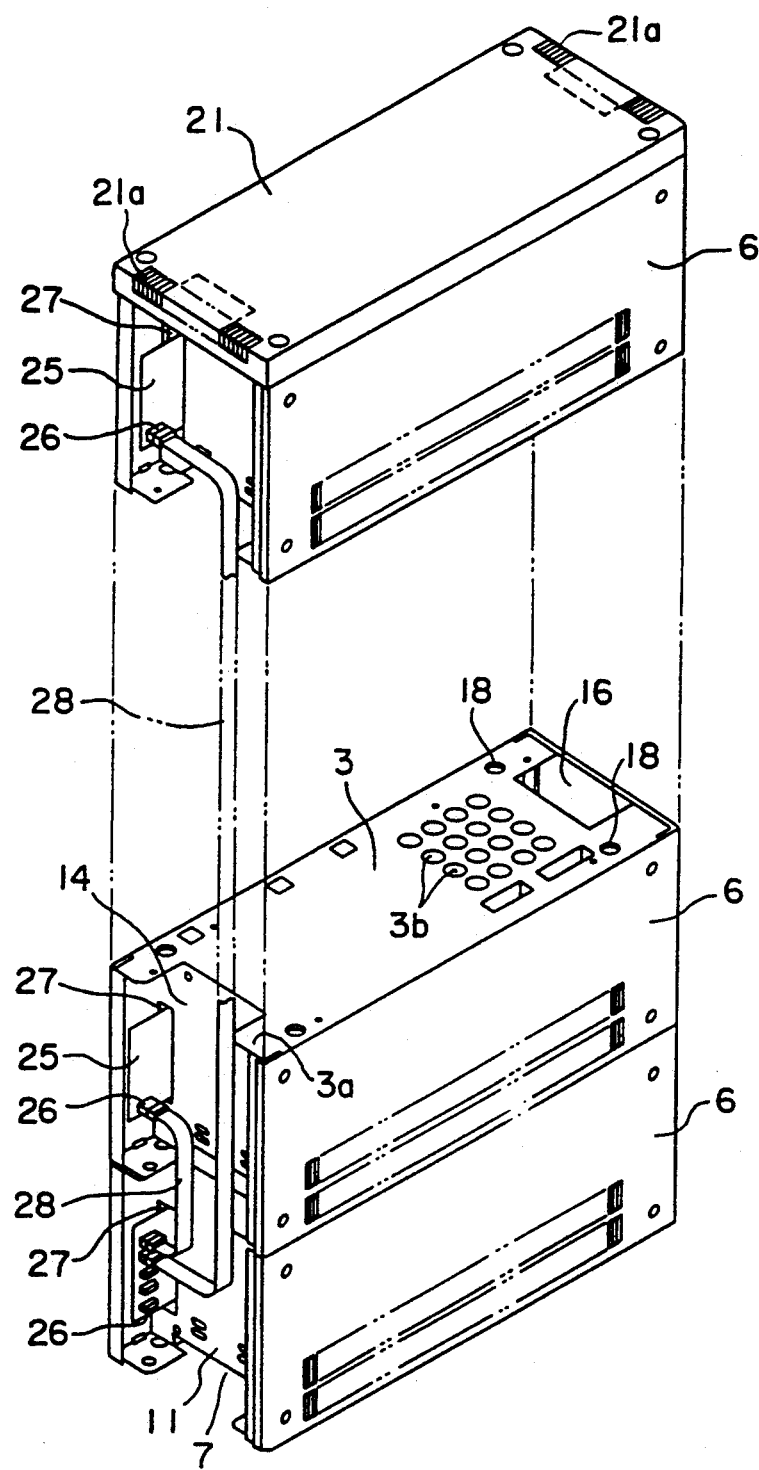
FIG. 5 is a perspective view showing cables routed among the tiered electronic equipment housings in accordance with the present invention.

The mother board 25 has a cable connector 26 at the left end thereof. As shown in FIGS. 2 and 5, the cable connector 26 is protruded to the vertical duct 14 via a through-hole 27 disposed on the main plate member 11a of the left support plate 11. The cable connector 26 is connected to a cable 28 which passes through the vertical duct 14.

In accordance with this embodiment, when a plurality of electronic equipment housings 1 are tiered, an upper electronic equipment housing 1 and a lower electronic equipment housing 1 are positioned and fixed with screws so that the convex members 17 of the bottom plate 2 of the upper housing 1 are secured to the concave members 18 of the top plate 3 of the lower housing 1. Thus, as shown in FIG. 5, the vertical duct 14 of the upper electronic equipment housing 1 is connected to the vertical duct 14 of the lower electronic equipment housing 1. Since the cable 28 can pass through these vertical ducts 14, the electronic circuit boards of the plurality of electronic equipment housings 1 can be connected each other.

Since the left and right vertical ducts 14 and 16 are covered by the left and right dress plates 13 and 15, respectively, the cable 28 is housed in the electronic equipment housing 1, not exposed to the outside thereof. Thus, the cable can be prevented from being damaged and being disconnected from the corresponding connector.

In addition, since the end protrusion members 2a and 3a of the bottom plate 2 and the top plate 3 which form the openings 8 and 9 contact the bend members 11b and 12b of the support plates 11 and 12, the rigidity of the openings 8 and 9 can be improved.

Figure 6:
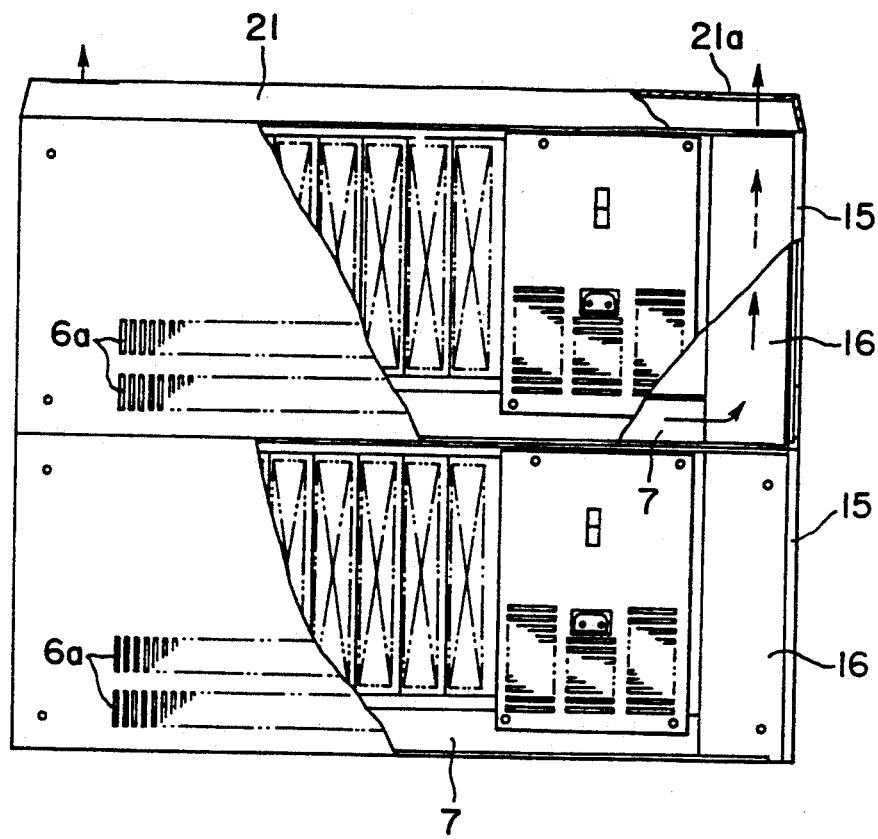
FIG. 6 is a partial sectional view showing the front of two electronic equipment housings being tiered.

Since the present invention is constructed as described above, when the electronic equipment operates, as shown in FIG. 6, air guided from the air intake openings 6a cools the electronic components and so forth which generate heat. The air flows from the air ventilation openings 3b to the horizontal air passageway 7. Next, the air flows upwardly through the common vertical duct 16. Thereafter, the air is expelled to the outside of the electronic equipment housing 1 through the slits 21a of the top dress plate 21.

Next, with reference to FIGS. 7 and 8, a drop protection mechanism for a plug-in unit will be described.

Figure 7:
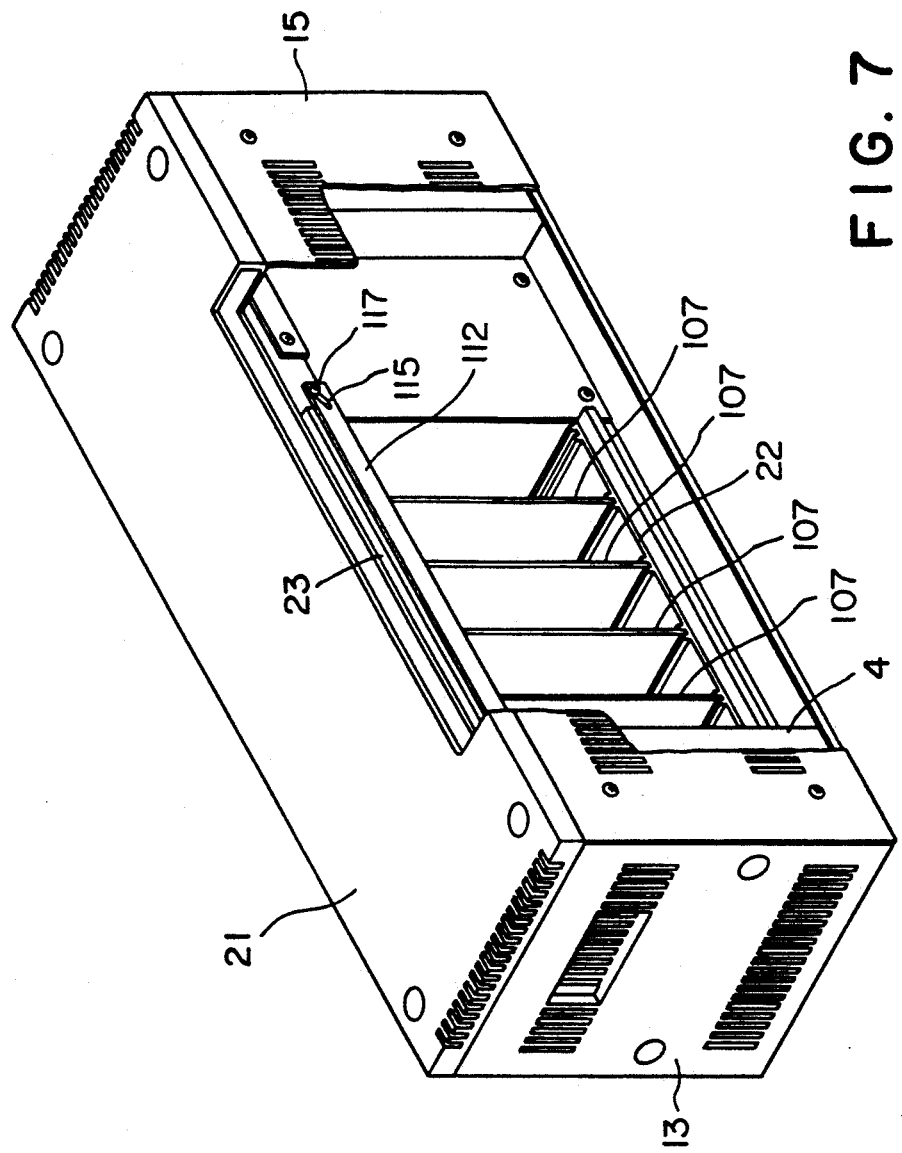
FIG. 7 is a perspective view showing an electronic equipment housing in accordance with another embodiment of the present invention.
Figure 8:
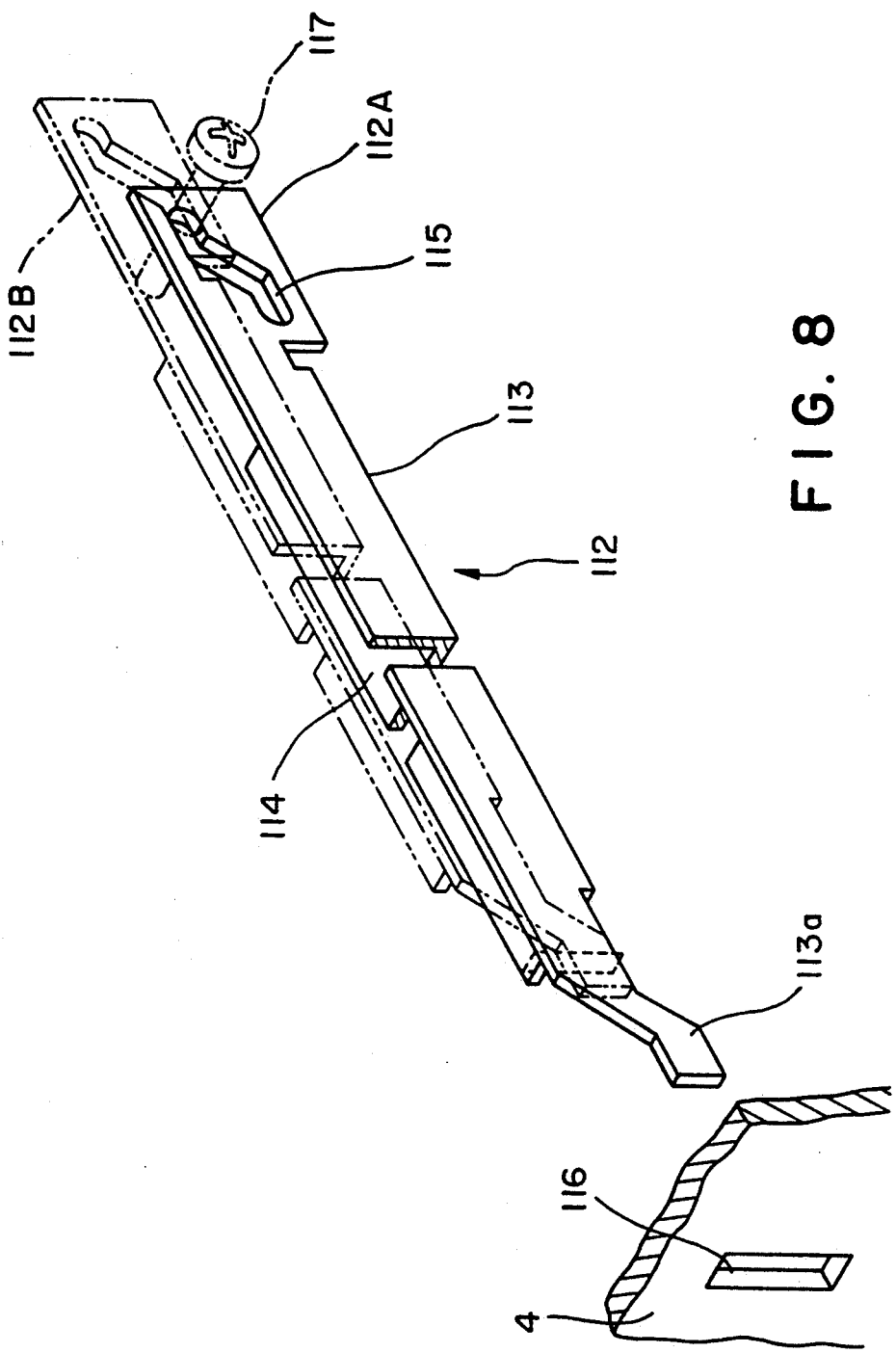
FIG. 8 is a perspective view showing a stopper mechanism of a plug-in unit.

In FIGS. 7 and 8, an electronic equipment housing 1 has a lower circuit board guide 22 and an upper circuit board guide 23. At the front of the circuit board guide 23, a stopper mechanism 112 is disposed. As shown in FIG. 8, the stopper mechanism 112 comprises a longitudinal guide bar 113 and a stopper member 114 which is bent by 90° against the guide bar 113. The guide bar 113 has a first end member 113a in a crank shape and a second end member with a guide hole 115.

The first end member 113a in the crank shape is inserted into a rectangular hole 116 on the side plate 4. A screw 117 passes through the guide hole 115. The screw 117 is fastened to a bend portion on the top plate 3 of the housing 1. Thus, the first end member 113a of the stopper mechanism 112 is inserted into the rectangular hole 116 of the side plate 4 and supported thereby. In addition, the second end member is supported by the screw 117 and extensibly moved along the front end surface of the circuit board guide 23. As shown in FIG. 8, when the stopper mechanism 112 is placed in a drop protecting position 112A shown by the solid lines, the stopper member 114 contacts the plug-in unit 107. On the other hand, when the stopper mechanism 112 is placed in a retreat position 112B, since the stopper member 114 does not contact the plug-in unit 107, the plug-in unit 107 can be extracted.

The screw 117 is tightened when the guide bar 113 is placed in the drop protecting position 112A or the retreat position 112B.

Next, the operation of this embodiment will be described.

When the stopper mechanism 112 is placed in the drop protecting position 112A, since the stopper member 114 contacts the plug-in unit 107 which is housed in the housing 1, the stopper mechanism 112 prevents the plug-in unit 107 from dropping. Thus, even if the electronic equipment is exposed to vibration or shocks during transportation or operation, the connector plug of the plug-in unit 107 can be prevented from dropping from the connector jack 26 of the mother board 25.

In the situations where another plug-in unit 107 is added or the electronic equipment is maintained, by loosening the screw 117 and then sliding the guide bar 113 in the right direction of FIG. 8, the guide bar 113 is moved upwardly to the retreat position 112B by the engagement of the guide hole 115 and the screw 117. In this position, by tightening the screw 117 and fixing the guide bar 113 in the retreat position 112B, the plug-in unit 107 can be easily inserted into the housing 1 or extracted therefrom.

In the above-mentioned embodiment, the stopper mechanism 112 is mounted on the top plate 3 with the screw 117 so that the stopper mechanism 112 can be moved to the front of the protrusion end of the circuit board guide 23. However, the stopper mechanism 112 can be mounted directly to the protrusion end of the circuit board guide 22 with the screw 117. Moreover, the stopper mechanism 112 can be mounted to the front of the protrusion end of the circuit board guide 22.

According to this embodiment, only by moving the stopper mechanism from the drop protecting position to the retreat position, the plug-in unit can be inserted and extracted. Thus, the expansion work of a plug-in unit and the maintenance and inspection works of the electronic equipment can be very easily performed.

Furthermore, when another plug-in unit is added or the electronic equipment is maintained or inspected, it is not necessary to remove the stopper member. The stopper member can be prevented from being missed during such works.

What is claimed is:

1. An electronic equipment assembly housing electronic circuitry, the assembly comprising:
    at least two housings, each of the housings including a top plate having a plurality of air ventilation openings, a bottom plate having a U-shaped cross section to define a horizontal air passageway within the U shape along a first longitudinal axis of the bottom plate, a first support plate fixedly secured to the top and bottom plates and having a first bracket-shaped cross-section having a channel facing a direction away from an internal part of the housing to define a first vertical duct within the channel and along a second longitudinal axis substantially perpendicular to the first longitudinal axis and in fluid communication with the horizontal air passageway, the first vertical duct being separated from the internal part of the housing by a bight section of the channel, and a second support plate fixedly secured to the top and bottom plates;
    wherein one of the at least two housings is mounted on another of the housings so that each of the first vertical ducts of the housings is vertically aligned, and the horizontal air passageway of said one of the at least two housings is above the top plate of said another of the housings, so as to form an air path permitting air to flow through the plurality of air ventilation openings of at least one of the top plates to at least one of the horizontal air passageways and through at least one of the first vertical ducts.

2. The electronic equipment assembly according to claim 1 wherein the second support plate has a second bracket-shaped cross-section and defines a second vertical duct parallel to the second longitudinal axis and in fluid communication with the horizontal air passageway.

3. The electronic equipment according to claim 2 wherein each of the second vertical ducts of the first and second housings are vertically aligned.

4. The electronic equipment according to claim 1 wherein each of the at least two housings further comprises a front plate connected to the first and second support plates.

5. The electronic equipment according to claim 4 wherein each of the front plates have a plurality of air intake openings in fluid communication with the plurality of air ventilation openings of a respective top plate.

6. The electronic equipment according to claim 2 wherein each of the at least two housings further comprises first and second dress plates respectively connected to the first and second support plates, the first and second dress plates respectively covering the first and second vertical ducts.

7. The electronic equipment according to claim 1 wherein each of the top plates has a convex member, and each of the bottom plates has a concave member for mating with a respective convex member when said one of the at least two housings is mounted on said another of the housings.

8. An electronic equipment assembly housing electronic circuitry, the assembly comprising:
    a first housing mounted on a second housing, each of the first and second housings including a top plate having a plurality of air ventilation openings, a bottom plate having a U-shaped cross section to define a horizontal air passageway within the U shape along a first longitudinal axis of the bottom plate, a left support plate connected to the top and bottom plates and having a first bracket-shaped cross-section having a channel facing a direction away from an internal part of the housing to define a first vertical duct within the channel and along a second longitudinal axis substantially perpendicular to the first longitudinal axis and in fluid communication with the horizontal air passageway, the first vertical duct being separated from the internal part of the housing by a bight section of the channel, a right support plate connected to the top and bottom plates and having a second bracket-shaped cross-section to define a second vertical duct parallel to the second longitudinal axis and in fluid communication with the horizontal air passageway, and a front plate connected to the left and right support plates having a plurality of air intake openings;
    wherein the first housing is mounted on the second housing so that each of the first vertical ducts of the first and second housings are vertically aligned, each of the second vertical ducts of the first and second housings are vertically aligned, and the horizontal air passageway of the first housing is directly above the top plate of the second housing so as to form an air path permitting air to flow through the plurality of air intake openings of the front plate of the second housing to the plurality of air ventilation openings of the top plate of the second housing to the horizontal air passageway of the first housing and through the first and second vertical ducts of the first housing.

9. The electronic equipment assembly according to claim 8 wherein each of the first and second housings further comprise left and right dress plates respectively connected to the left and right support plates, the left and right dress plates respectively covering the first and second vertical ducts.

10. The electronic equipment assembly according to claim 8 wherein each of the top plates has a convex member, and each of the bottom plates has a concave member for mating with a respective convex member when the first housing is mounted on the second housing.

11. An electronic equipment assembly housing electronic circuitry having a plurality of cables for connecting electronic equipment, the assembly comprising:
at least two housings, each of the housings including a top plate, a bottom plate substantially parallel to the top plate, a first support plate connected to the top and bottom plates and having a bracket-shaped cross-section having a channel facing a direction away from an internal part of the housing to define a first vertical duct within the channel and along a longitudinal axis substantially perpendicular to the top plate, the first vertical duct being separated from the internal part of the housing by a bight section of the channel, and a second support plate connected to the top and bottom plates;
wherein one of the at least two housings is mounted on another of the housings so that each of the first vertical ducts of the housings is vertically aligned, and the plurality of cables is housed in each of the first vertical ducts.

12. The electronic equipment assembly according to claim 11 wherein each of the top plates has a convex member, and each of the bottom plates has a concave member for mating with a respective convex member when said one of the at least two housings is mounted on said another of the housings.

13. An electronic equipment assembly housing a plug-in unit of electronic equipment, the assembly comprising:
a housing including at least one side plate, the side plate having an opening;
a mother board disposed in the housing;
first and second circuit board guides having front protrusion ends, the first and second circuit board guides being disposed in the housing oppositely and substantially perpendicularly to the mother board and gripping and guiding the mother board;
a connector disposed on the mother board and connected to the plug-in unit;
a stopper mechanism disposed at the front protrusion end of one of the first and second circuit board guides, the stopper mechanism including a guide bar and a stopper member, the guide bar having a first end member slidably residing in said opening, the guide bar further including a crank shaped guide hole extensibly movable along the front protrusion end of said one of the first and second circuit board guides, the stopper member being substantially perpendicular to the guide bar and securable to the plug-in unit;
wherein the stopper mechanism is movable between a drop protecting position when the stopper member is secured to the plug-in unit to prevent the plug-in unit from dropping out of the housing, and a retreat position to allow removal of the plug-in unit when the stopper member is unsecured to the plug-in unit allowing the guide bar to slide along the front protrusion end of said one of the first and second circuit board guides and allowing the first end member to slide in said opening.

14. The electronic equipment assembly of claim 13 further comprising a screw member passing through the guide hole to connect the stopper mechanism to the front protrusion end of said one of the first and second circuit board guides.

* * * * *

UNITED STATES PATENT AND TRADEMARK OFFICE
CERTIFICATE OF CORRECTION

PATENT NO. : 5,319,520
DATED     : June 07, 1994
INVENTOR(S) : Akira Sugiyama et al.

It is certified that error appears in the above-indentified patent and that said Letters Patent is hereby corrected as shown below:

In Column 6, Claims 3,4,5,6, and 7, Lines 9,12,16,20, and 26 respectively: after "equipment" insert --assembly--.

Signed and Sealed this

Twenty-first Day of February, 1995

BRUCE LEHMAN

Attest:

Attesting Officer

Commissioner of Patents and Trademarks